US012765135B2

(12) United States Patent
Hsu et al.

(10) Patent No.: US 12,765,135 B2
(45) Date of Patent: Oct. 13, 2026

(54) DISPLAY APPARATUS AND MANUFACTURING METHOD OF DISPLAY PANEL

(71) Applicant: AUO Corporation, Hsinchu (TW)

(72) Inventors: Yi-Yueh Hsu, Hsinchu (TW); Kuan-Hsun Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 415 days.

(21) Appl. No.: 18/336,033

(22) Filed: Jun. 16, 2023

(65) Prior Publication Data

US 2024/0274761 A1 Aug. 15, 2024

(30) Foreign Application Priority Data

Feb. 14, 2023 (TW) ................................ 112105168

(51) Int. Cl.

| | |
|---|---|
| ***H10H 20/853*** | (2025.01) |
| ***H10H 20/01*** | (2025.01) |
| ***H10H 20/857*** | (2025.01) |
| ***H10W 90/00*** | (2026.01) |

(52) U.S. Cl.

CPC ........ *H10H 20/853* (2025.01); *H10H 20/857* (2025.01); *H10W 90/00* (2026.01); *H10H 20/0362* (2025.01)

(58) Field of Classification Search

CPC ............... H10H 20/853; H10H 20/857; H10H 20/0362; H01L 25/0753; H01L 25/167

USPC .......................................................... 313/500

See application file for complete search history.

(56) References Cited

U.S. PATENT DOCUMENTS

| | | | |
|---|---|---|---|
| 9,859,526 B2 | 1/2018 | Lee et al. | |
| 12,166,020 B2 | 12/2024 | Shin | |
| 2016/0233453 A1 | 8/2016 | Lee et al. | |
| 2019/0254178 A1 | 8/2019 | Chen et al. | |
| 2020/0235075 A1* | 7/2020 | Tsai | G02B 1/11 |
| 2022/0084994 A1 | 3/2022 | Shin | |
| 2022/0301503 A1* | 9/2022 | Yan | G09G 3/3225 |

FOREIGN PATENT DOCUMENTS

| | | |
|---|---|---|
| CN | 204145887 | 2/2015 |
| CN | 110161733 | 8/2019 |
| CN | 212541358 | 2/2021 |

(Continued)

OTHER PUBLICATIONS

Translation of WO 2021-230509 A1 to Shin (Year: 2021).*
Espacenet Patent Search Complete (Global Dossier) (Year: 2015).*

*Primary Examiner* — James R Greece
*Assistant Examiner* — Hana S Featherly
(74) *Attorney, Agent, or Firm* — JCIPRNET

(57) ABSTRACT

A display apparatus includes a display panel. The display panel includes a driving backplane, multiple light-emitting elements, an encapsulation layer, and a fixing glue. The light emitting elements are disposed on the driving backplane and electrically connected to the driving backplane. The encapsulation layer is disposed on the driving backplane and covers the light emitting elements. The encapsulation layer includes a protruding portion extending beyond the driving backplane. The fixing glue is disposed between the protruding portion of the encapsulation layer and a side wall of the driving backplane. In addition, a manufacturing method of the display panel is also proposed.

6 Claims, 9 Drawing Sheets

(56) References Cited

FOREIGN PATENT DOCUMENTS

| | | | | |
|---|---|---|---|---|
| CN | 214797402 | | 11/2021 | |
| KR | 20160099158 | | 8/2016 | |
| KR | 20210141146 | | 11/2021 | |
| WO | WO-2021230509 | A1 * | 11/2021 | ......... H01L 25/0753 |

* cited by examiner

DISPLAY APPARATUS AND MANUFACTURING METHOD OF DISPLAY PANEL

CROSS-REFERENCE TO RELATED APPLICATION

This application claims the priority benefit of Taiwan application serial no. 112105168, filed on Feb. 14, 2023. The entirety of the above-mentioned patent application is hereby incorporated by reference herein and made a part of this specification.

BACKGROUND

Technical Field

This disclosure relates to a display apparatus and a manufacturing method of a display panel.

Description of Related Art

The light-emitting diode display panel includes a driving backplane, multiple light-emitting diode elements transposed on the driving backplane, and an encapsulation structure covering the light-emitting diode elements. Inheriting the characteristics of light-emitting diode, the light-emitting diode display panel has the advantages of power saving, high efficiency, high brightness, and fast response time, etc. In addition, compared with organic light-emitting diode display panels, the light-emitting diode display panels also have the advantages of easy color adjustment, long luminous life, and no image burn-in. Therefore, the light-emitting diode display panels are considered as the next generation of display technology. However, in the process of curing the encapsulation elements to form the encapsulation structure of light-emitting diode display panels, due to the material characteristics of the encapsulation elements themselves, the encapsulation structure is prone to uneven wave marks on its edges, resulting in poor appearance.

SUMMARY

The disclosure provides a manufacturing method of a display panel, capable of producing a display panel with good quality in appearance.

The disclosure provides a display apparatus with good quality in appearance.

The manufacturing method of a display panel of the disclosure includes the following. Multiple light-emitting elements are disposed on a driving backplane, and the light-emitting elements are electrically connected to the driving backplane. An encapsulation element is disposed on the driving backplane to cover the light-emitting elements, in which the encapsulation element has an extension portion extending beyond the driving backplane. A fixing glue is formed between the extension portion of the encapsulation element and a side wall of the driving backplane to fix the extension portion of the encapsulation element and the driving backplane. The encapsulation element is cured to form an encapsulation structure with the extension portion of the encapsulation element fixed to the driving backplane.

A display apparatus of the disclosure includes at least one display panel. Each of the at least of display panel includes a driving backplane, multiple light-emitting elements, an encapsulation layer, and a fixing glue. The light-emitting elements are disposed on the driving backplane and electrically connected to the driving backplane. The encapsulation layer is disposed on the driving backplane and covers the light-emitting elements. The encapsulation layer includes a protruding portion extending beyond the driving backplane. The fixing glue is disposed between the protruding portion of the encapsulation layer and a side wall of the driving backplane.

To make the aforementioned more comprehensive, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
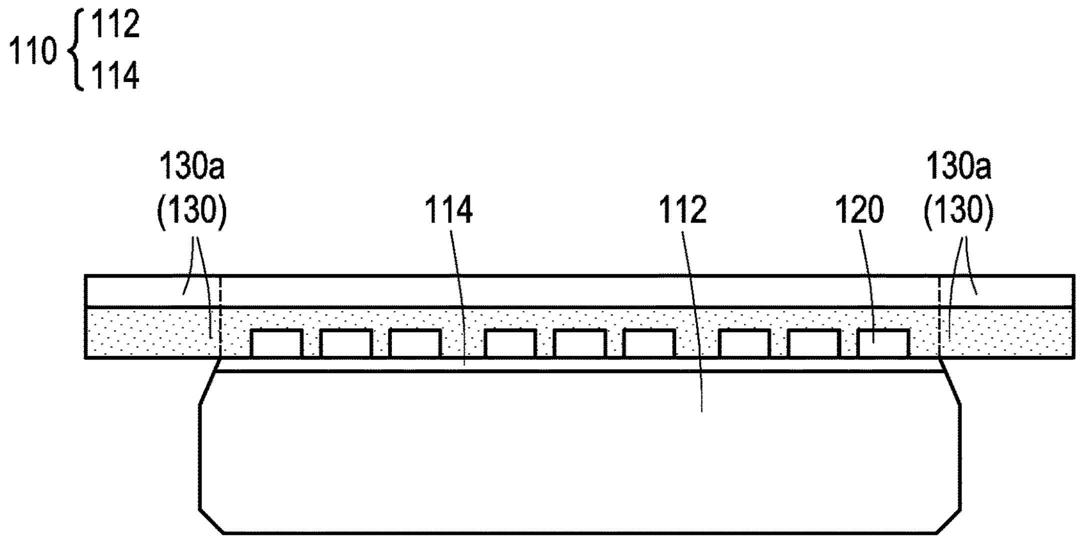
FIG. 1A to FIG. 1E are schematic cross-sectional views of a manufacturing process of a display panel according to an embodiment of the disclosure.

Reference will now be made in detail to the exemplary embodiments of the disclosure, examples of which are illustrated in the accompanying drawings. Wherever possible, the same reference symbols are used in the drawings and descriptions to denote the same or like parts.

It should be understood that when an element such as a layer, film, region, or substrate is referred to as being "on" or "connected to" another element, it can be directly on or connected to the other element, or intermediate elements may also be present. In contrast, when an element is referred to as being "directly on" or "directly connected to" another element, there are no intermediate elements present. As used herein, "connected" may refer to physical and/or electrical connection. Furthermore, "electrically connected" or "coupled" can mean that there are other elements between two elements.

As used herein, "about," "approximately," or "substantially" includes average of the stated values and an acceptable range of deviations from the specified values as determined by a person of ordinary skill in the art, taking into account the specific amount of measurement and measurement-related error discussed (i.e., the limitations of the measurement system). For example, "about" can mean within one or more standard deviations of the stated value, or within ±30%, ±20%, ±10%, ±5%. Furthermore, the terms "about", "approximately", or "substantially" as used herein can be chosen from a range of more acceptable deviations or standard deviations depending on the optical, etching, or other properties, rather than one standard deviation for all properties.

Unless otherwise defined, all terms used herein, including technical and scientific terms, have the same meaning as commonly understood by a person of ordinary skill in the art. It will be further understood that terms such as those defined in commonly used dictionaries shall be construed to have a meaning consistent with their meaning in the context of the relevant art and the disclosure and will not be construed to have an idealized or overly formal meaning unless expressly defined as such herein.

FIG. 1A to FIG. 1E are schematic cross-sectional views of a manufacturing process of a display panel 100 according to an embodiment of the disclosure.

Referring to FIG. 1A, first, multiple light-emitting elements 120 are disposed on a driving backplane 110, and the light-emitting elements 120 are electrically connected to the driving backplane 110. In this embodiment, the driving backplane 110 includes a substrate 112 and a circuit layer 114 disposed on the substrate 112. The circuit layer 114 includes multiple pixel driving circuits (not shown) and multiple pad sets (not shown) electrically connected to the pixel driving circuits respectively, and multiple electrodes (not shown) of each of the light emitting elements 120 are electrically connected to multiple pads (not shown) of a corresponding pad set. For example, in this embodiment, a material of the substrate 112 may be glass, quartz, organic polymer, or other applicable materials. The light-emitting element 120 may be a micro light-emitting diode (μLED); but the disclosure is not limited thereto.

Referring to FIG. 1A, next, an encapsulation element 130 is disposed on the driving backplane 110 to cover the light-emitting elements 120. The encapsulation element 130 has an extension portion 130*a* extending beyond the driving backplane 110. For example, in this embodiment, the encapsulation element 130 may extend beyond all edges of the driving backplane 110, and the extension portion 130*a* may be an annular region around the encapsulation element 130, but the disclosure is not limited thereto.

Figure 1B:
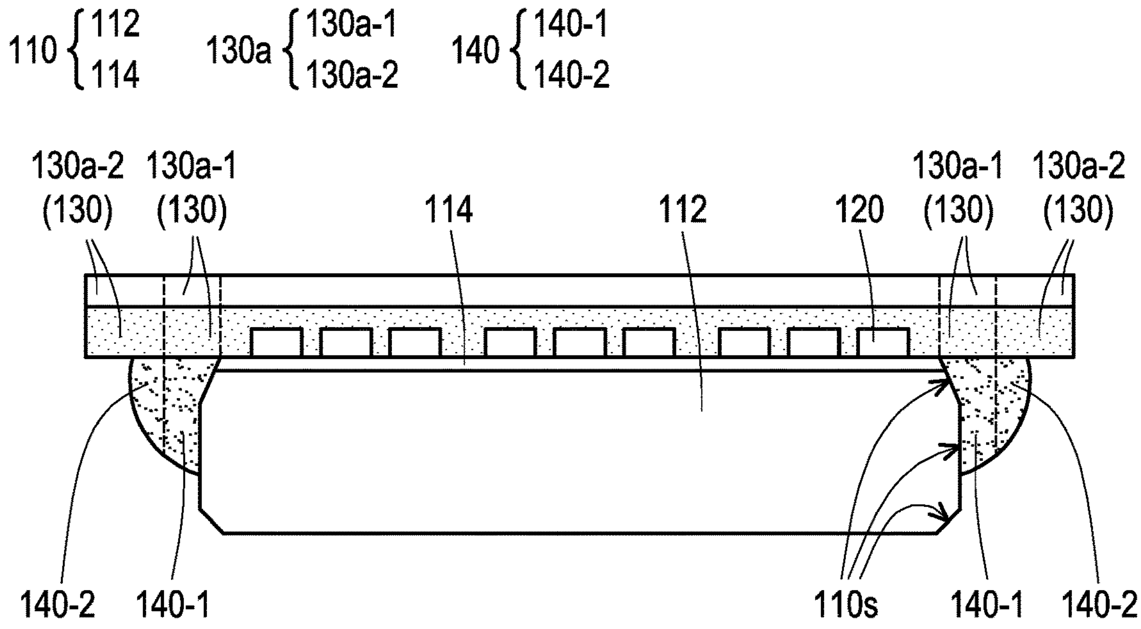

Referring to FIG. 1B, next, a fixing glue 140 is formed between the extension portion 130*a* of the encapsulation element 130 and a side wall 110*s* of the driving backplane 110 to fix the extension portion 130*a* of the encapsulation element 130 and the driving backplane 110. In this embodiment, the fixing glue 140 may be formed by painting, spraying or other methods, and the disclosure is not limited thereto. In this embodiment, the fixing glue 140 may directly connect the extension portion 130*a* of the encapsulation element 130 and the driving backplane 110. In this embodiment, the extension portion 130*a* of the encapsulation element 130 may include a first sub-portion 130*a*-1 close to the side wall 110*s* of the driving backplane 110 and a second sub-portion 130*a*-2 far from the side wall 110*s* of the driving backplane 110. The fixing glue 140 may include a first portion 140-1 and a second portion 140-2 respectively overlapping the first sub-portion 130*a*-1 and the second sub-portion 130*a*-2 of the extension portion 130*a* of the encapsulation element 130.

Figure 2:
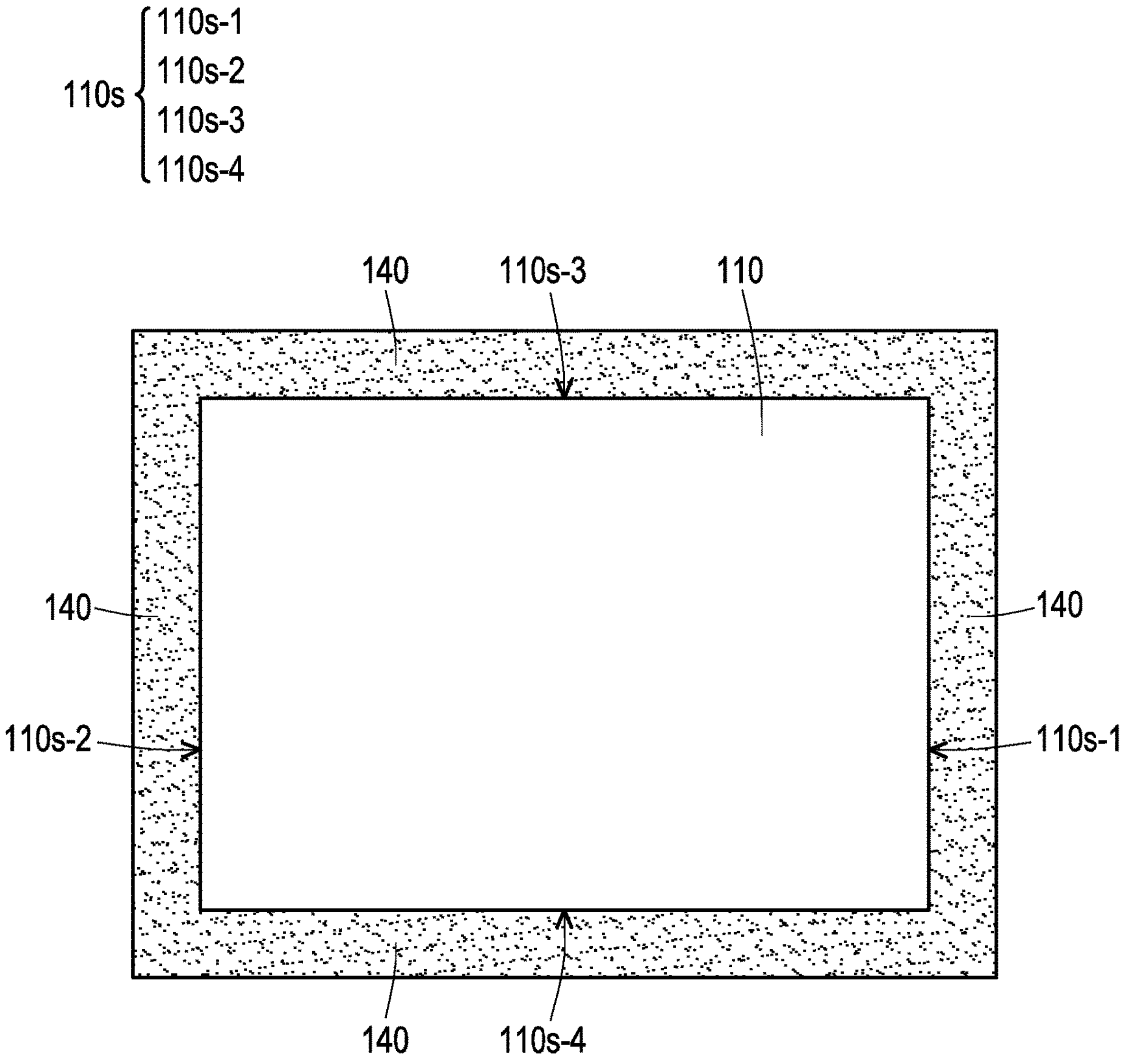
FIG. 2 is a schematic top view of a driving backplane 110 and a fixing glue 140 in FIG. 1B.

FIG. 2 is a schematic top view of a driving backplane 110 and a fixing glue 140 in FIG. 1B. Referring to FIG. 1B and FIG. 2, in this embodiment, the fixing glue 140 may be selectively disposed between the extension portion 130*a* of the encapsulation element 130 and all the side walls 110*s* of the driving backplane 110, and the fixing glue 140 may be annular in shape. For example, in this embodiment, the side wall 110*s* of the driving backplane 110 may include a first sub-side wall 110*s*-1, a second sub-side wall 110*s*-2 disposed opposite to the first sub-side wall 110*s*-1, a third sub-side wall 110*s*-3 connected between the first sub-side wall 110*s*-1 and the second sub-side wall 110*s*-2, and a fourth sub-side wall 110*s*-4 connected between the first sub-side wall 110*s*-1 and the second sub-side wall 110*s*-2 and disposed opposite to the third sub-side wall 110*s*-3. The fixing glue 140 may be disposed between the extension portion 130*a* of the encapsulation element 130 and the first sub-side wall 110*s*-1, the second sub-side wall 110*s*-2, the third sub-side wall 110*s*-3, and the fourth sub-side wall 110*s*-4 of the driving backplane 110. The fixing glue 140 may be selectively in the shape of a frame, but the disclosure is not limited thereto.

Figure 1C:
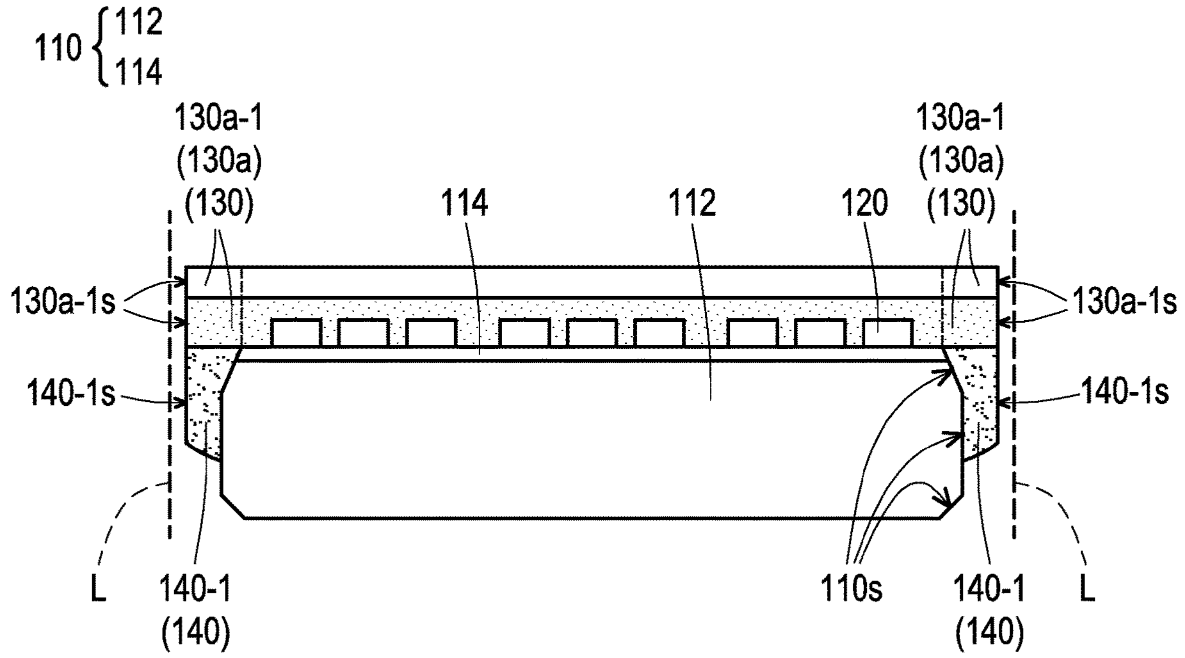

Referring to FIG. 1B and FIG. 1C, in this embodiment, after the fixing glue 140 is formed between the extension portion 130*a* of the encapsulation element 130 and the side wall 110*s* of the driving backplane 110, and before the encapsulation element 130 is cured, the second sub-portion 130*a*-2 of the extension portion 130*a* of the encapsulation element 130 and the second portion 140-2 of the fixing glue 140 may be removed to form a side wall 130*a*-1*s* of the first sub-portion 130*a*-1 of the extension portion 130*a* and a side wall 140-1*s* of the first portion 140-1 of the fixing glue 140. In this embodiment, the second sub-portion 130*a*-2 of the extension portion 130*a* and the sub-portion 140-2 of the fixing glue 140 may be removed simultaneously, and the remaining first sub-portion 130*a*-1 of the extension portion 130*a* and the side walls 130*a*-1*s* and 140-1*s* of the first portion 140-1 of the fixing glue 140 may be substantially aligned. For example, in this embodiment, the second sub-portion 130*a*-2 of the extension portion 130*a* of the encapsulation element 130 and the second portion 140-2 of the fixing glue 140 may be removed simultaneously using a laser L-cutting process, but the disclosure is not limited thereto.

Figure 1D:
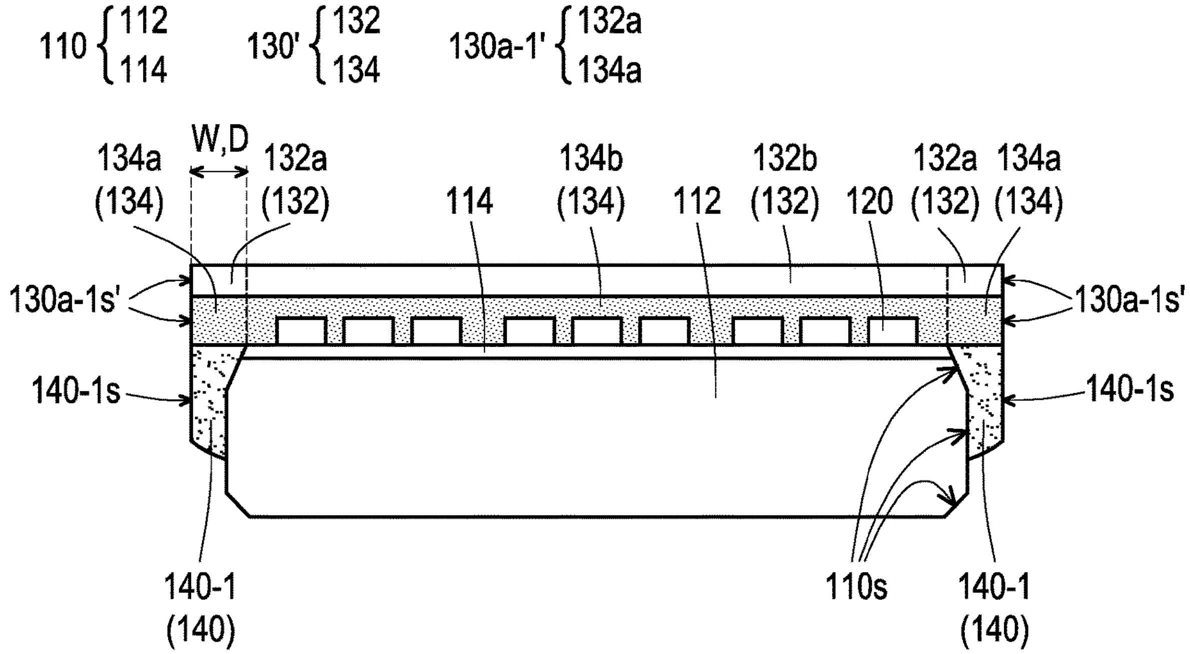

Referring to FIG. 1C and FIG. 1D, next, the encapsulation element 130 is cured to form an encapsulation structure 130' with the extension portion 130*a* of the encapsulation element 130 fixed to the driving backplane 110. Referring to FIG. 1B, FIG. 1C, and FIG. 1D, in detail, in this embodiment, the encapsulation component 130 may be cured to form the encapsulation structure 130' after the second sub-portion 130*a*-2 of the extension portion 130*a* of the encapsulation element 130 and the second sub-portion 140-2 of the fixing glue 140 are removed. The encapsulation structure 130' includes a protruding portion 130*a*-1' formed by curing the first sub-portion 130*a*-1 of the extension portion 130*a*, and a side wall 130*a*-1*s*' of the protruding portion 130*a*-1' is substantially aligned with the side wall 140-1*s* of the first portion 140-1 of the fixing glue 140. In this embodiment, a width W of the protruding portion 130*a*-1' of the encapsulation structure 130' extending beyond the driving backplane 110 and a maximum distance D between the side wall 140-1*s* of the fixing glue 140 and the side wall 110*s* of the driving backplane 110 may be substantially equal. In this embodiment, the encapsulation element 130 may be cured using a heating process; however, the disclosure is not limited thereto, and in other embodiments, other processes (e.g., a lighting process) may also be used to cure the encapsulation element 130.

It should be noted that since the extension portion 130*a* of the encapsulation element 130 is fixed to the driving backplane 110, the encapsulation element 130 is not easily deformed by thermal contraction and expansion during the curing of the encapsulation element 130. In this way, the edges of the cured encapsulation structure 130' are less prone to bending and unevenness, e.g., wavy marks, which further enables the final formed display panel 100 (drawn in FIG. 1E) to have a good, flat appearance.

Referring to FIG. 1D, in this embodiment, the encapsulation structure 130' may include a release film 132 and an encapsulation layer 134. The encapsulation layer 134 is located between the release film 132 and the driving backplane 110. The release film 132 includes a protruding portion 132*a* extending beyond the driving backplane 110 and a main portion 132*b* inside the driving backplane 110. The encapsulation layer 134 includes a protruding portion 134*a* extending beyond the driving backplane 110 and a main portion 134*b* inside the driving backplane 110. The protruding portion 130*a*-1' of the encapsulation structure 130' includes the protruding portion 132*a* of the release film 132 and the protruding portion 134*a* of the encapsulation layer 134.

Figure 1E:
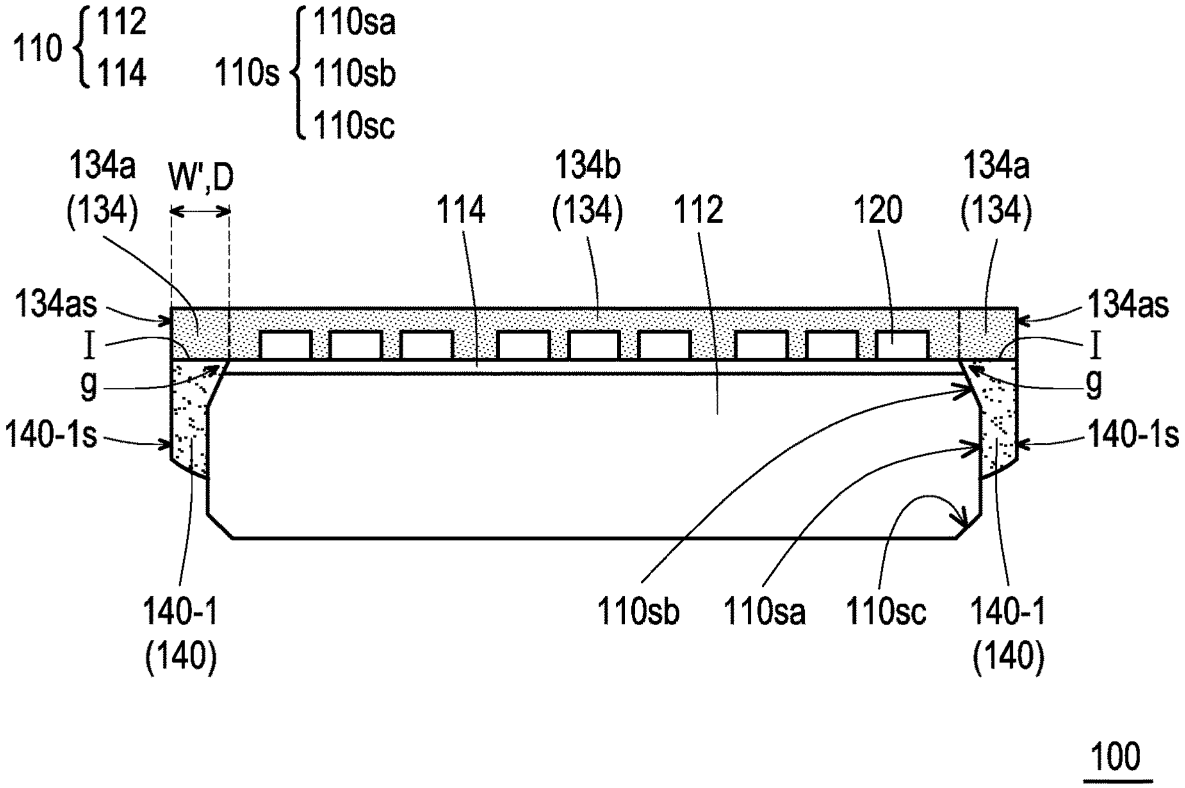

Referring to FIG. 1D and FIG. 1E, in this embodiment, next, the release film 132 may be removed from the encapsulation layer 134 with the main portion 134*b* of the encapsulation layer 134 covering the light-emitting elements 120 and the protruding portion 134*a* of the encapsulation layer 134 fixed to the side wall 110*s* of the driving backplane 110. Here, the display panel 100 according to this embodiment is completed. It should be noted that since the release film 132 is removed from the encapsulation layer 134 with the protruding portion 134*a* of the encapsulation layer 134 fixed to the side wall 110*s* of the driving backplane 110, the encapsulation layer 134 and the light-emitting element 120 and/or the circuit layer 114 under the encapsulation layer 134 are not easily removed or damaged during the removal of the release film 132. In this way, the manufacturing yield of the display panel 100 may be improved.

Referring to FIG. 1E, the display panel 100 includes the driving backplane 110, multiple light-emitting element 120, the encapsulation layer 134 and the fixing glue 140. The light-emitting elements 120 are disposed on the driving backplane 110 and are electrically connected to the driving backplane 110. The encapsulation layer 134 is disposed on the driving backplane 110 and covers the light-emitting elements 120. The encapsulation layer 134 includes the protruding portion 134*a* extending beyond the driving backplane 110, and the fixing glue 140 is disposed between the protruding portion 134*a* of the encapsulation layer 134 and the side wall 110*s* of the driving backplane 110.

Referring to FIG. 1E, in this embodiment, a side wall 134*as* of the protruding portion 134*a* of the encapsulation layer 134 and the side wall 140-1*s* of the first portion 140-1 of the fixing glue 140 may be substantially aligned. In this embodiment, a width W' of the protruding portion 134*a* of the encapsulation layer 134 extending beyond the driving backplane 110 and the maximum distance D between the side wall 140-1*s* of the fixing glue 140 and the side wall 110*s* of the driving backplane 110 may be substantially equal.

Referring to FIG. 1E, in this embodiment, adjacent two sides of the fixing glue 140 directly connect the protruding portion 134*a* of the encapsulation layer 134 and the side wall 110*s* of the driving backplane 110, respectively. In this embodiment, the side wall 110*s* of the driving backplane 110 may include a first portion 110*sa* and a second portion 110*sb*, the second portion 110*sb* of the side wall 110*s* is connected between the protruding portion 134*a* of the encapsulation layer 134 and the first portion 110*sa* of the side wall 110*s*, the second portion 110*sb* of the side wall 110*s* is inclined with respect to the first portion 110*sa* of the side wall 110*s*, and the fixing glue 140 may be filled into a gap g between the second portion 110*sb* of the side wall 110*s* and the protruding portion 134*a* of the encapsulation layer 134. In this embodiment, the fixing glue 140 may selectively cover part of the side wall 110*s* of the driving backplane 110 (e.g., a part of the second portion 110*sb* of the side wall 110*s* and a part of the first portion 110*sa* of the side wall 110*s*), but the disclosure is not limited thereto.

The second portion 110*sb* of the side wall 110*s* is a chamfer on the upper side of the driving backplane 110. The driving backplane 110 may selectively have or not have a chamfer on the upper side. In one embodiment, the driving backplane 110 may selectively have an upper chamfer, and the upper chamfer may be disposed on two opposite edges on the upper side of the driving backplane 110, but not on the other opposite two edges. For example, in one embodiment, the driving backplane 110 may be selectively rectangular in shape, and the upper chamfer may be disposed on the upper side of the driving backplane 110 on opposite two long sides, and not on the upper side of the driving backplane 110 on opposite two short sides, but the disclosure is not limited thereto.

In this embodiment, the side wall 110*s* of the driving backplane 110 may further include a third portion 110*sc*. The second portion 110*sb* of the side wall 110*s* is connected between the first portion 110*sa* of the side wall 110*s* and the third portion 110*sc* of the side wall 110*s*, and the third portion 110*sc* of the side wall 110*s* is inclined with respect to the second portion 110*sb* of the side wall 110*s*.

The third portion 110*sc* of the side wall 110*s* is a chamfer on the lower side of the driving backplane 110. The driving backplane 110 may selectively have or not have a chamfer on the lower side. In one embodiment, the driving backplane 110 may selectively have a lower chamfer, and the lower chamfer may be disposed on two opposite edges on the lower side of the driving backplane 110, but not on the other two opposite edges on the lower side of the driving backplane 110. For example, in one embodiment, the driving backplane 110 may be selectively rectangular in shape, and the lower chamfer may be disposed on the lower side of the driving backplane 110 on opposite two long sides, and not on the lower side of the driving backplane 110 on opposite two short sides, but the disclosure is not limited thereto. In another embodiment, the driving backplane 110 may selectively have a lower chamfer, and the lower chamfer may be disposed on all edges of the lower side of the driving backplane 110, but the disclosure is not limited thereto.

Figure 3:
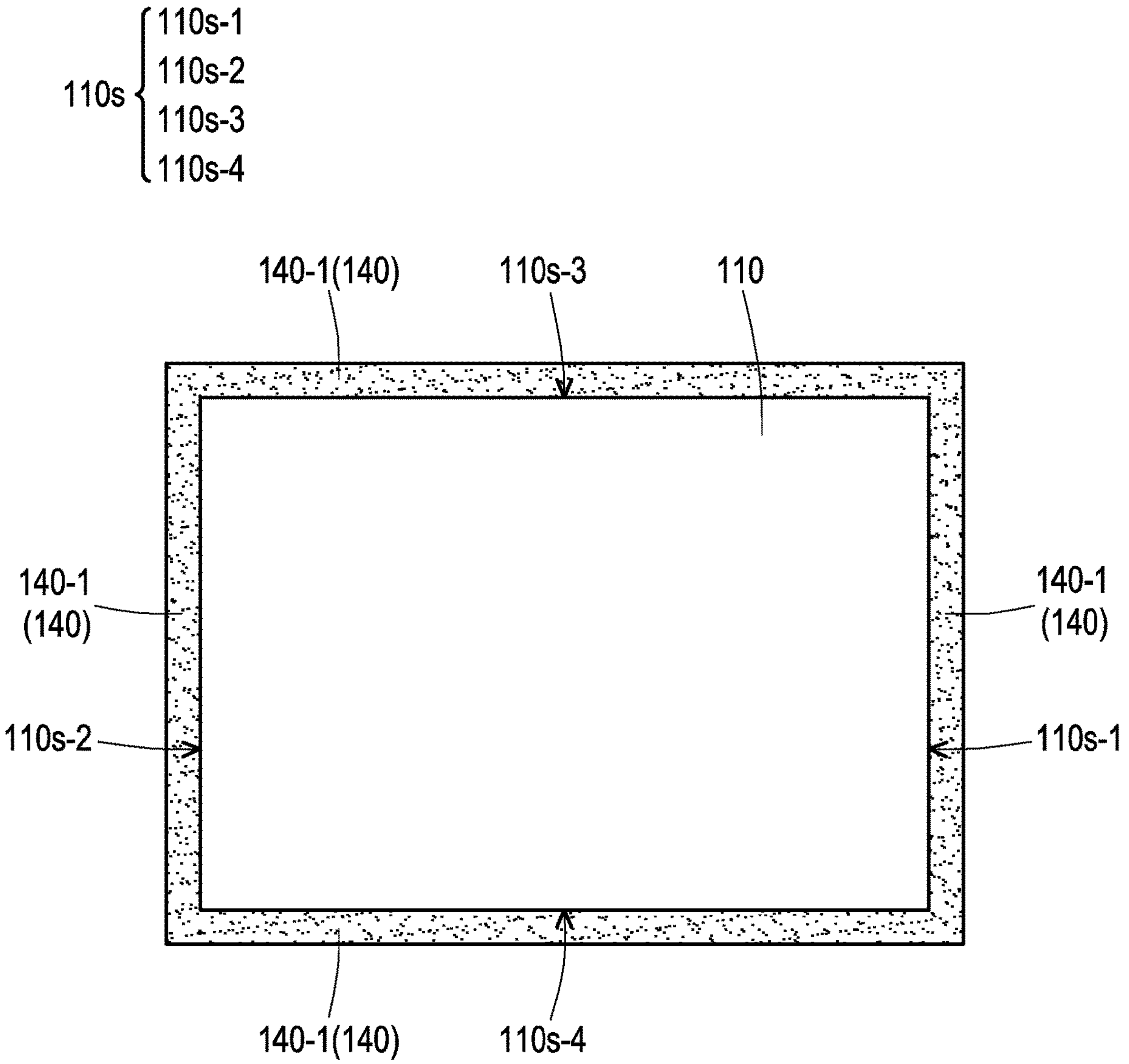
FIG. 3 is a schematic top view of the driving backplane 110 and the fixing glue 140 of a display panel 100 in FIG. 1E.

FIG. 3 is a schematic top view of the driving backplane 110 and the fixing glue 140 of a display panel 100 in FIG. 1E. Referring to FIG. 1E and FIG. 3, in this embodiment, the remaining part of the fixing glue 140 (i.e., the first portion 140-1 of the fixing glue 140) may be selectively disposed on the first sub-side wall 110*s*-1, the second sub-side wall 110*s*-2, the third sub-side wall 110*s*-3, and the fourth sub-side wall 110*s*-4 of the driving backplane 110, but the disclosure is not limited thereto.

Referring to FIG. 1E, in this embodiment, the encapsulation layer 134 has a boundary I with the fixing glue 140. That is, the encapsulation layer 134 and the fixing glue 140 are formed separately in two different processes, and the encapsulation layer 134 and the fixing glue 140 are not two parts of the same component. In this embodiment, light transmittance of the encapsulation layer 134 and light transmittance of the fixing glue 140 may be different. In detail, in this embodiment, the light transmittance of the fixing glue 140 may be selectively higher than the light transmittance of the encapsulation layer 134. For example, in this embodiment, the encapsulation layer 134 may be black glue or white glue, and the fixing glue 140 may be transparent glue, but the disclosure is not limited thereto.

Figure 4:
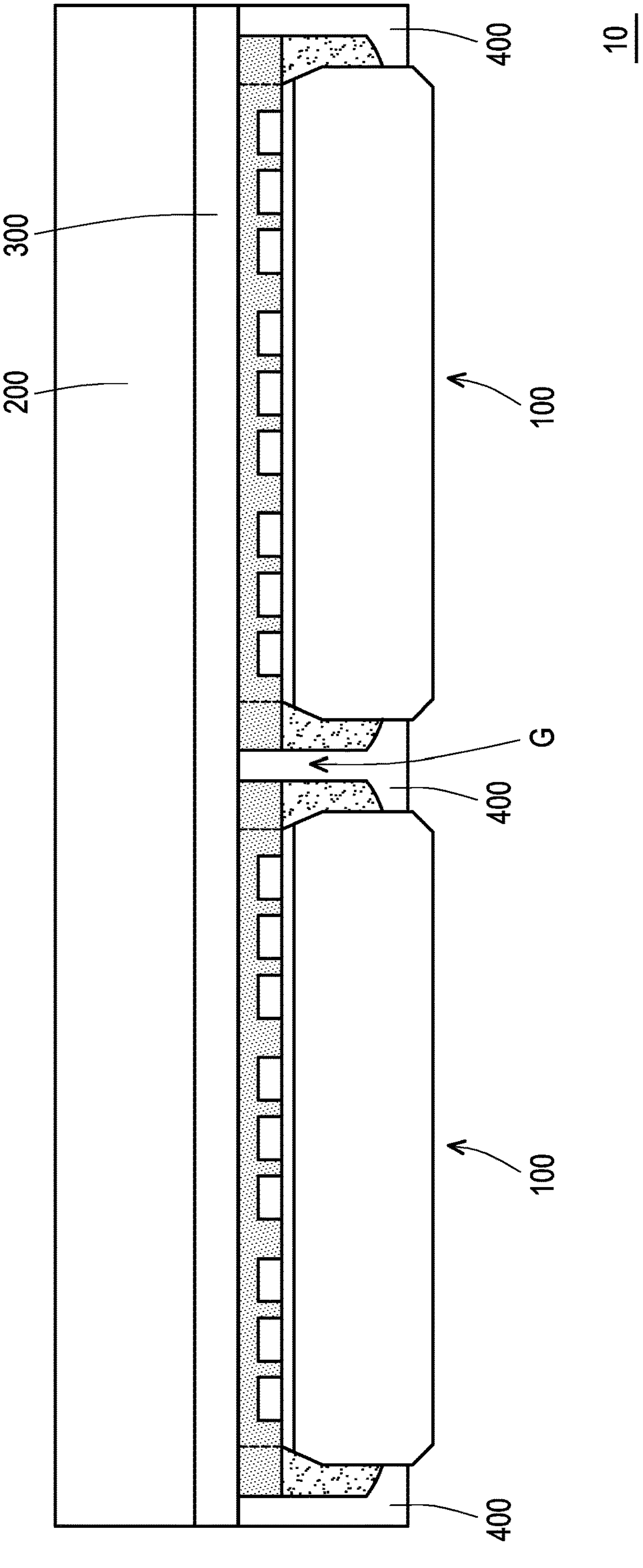
FIG. 4 is a schematic cross-sectional view of a display apparatus 10 according to an embodiment of the disclosure.

FIG. 4 is a schematic cross-sectional view of a display apparatus 10 according to an embodiment of the disclosure. Referring to FIG. 1E and FIG. 4, the display panel 100 may be formed with other display panels 100 to form a display apparatus 10 with a larger display area. The display apparatus 10 includes multiple display panels 100 and a sealant 400, in which the display panels 100 are arranged side by side, there is a gap G between the display panels 100, and the sealant 400 is filled at least in the gap G.

In this embodiment, material properties of the fixing glue 140 are different from those of the sealant 400. Specifically, in this embodiment, Young's modulus of the fixing glue 140 is greater than Young's modulus of the sealant 400. That is, the fixing glue 140 is harder than the sealant 400. For example, in this embodiment, a material of the fixing glue 140 may include epoxy, acrylic, or other suitable materials; a material of the sealant 400 may include silicon, epoxy, or other suitable materials, but the disclosure is not limited thereto.

In this embodiment, the display apparatus 10 may further include a light-transmitting protective cover 200 and a light-transmitting adhesive layer 300. The display panels 100 are disposed under the light-transmitting protective cover 200 and may be connected to the light-transmitting protective cover 200 using the light-transmitting adhesive layer 300.

It should be noted that the following embodiments follow the numeral references and parts of the preceding embodiments, where the same symbols are used to indicate the same or similar components, and the description of the same technical content is omitted. The description of the omitted parts can be referred to the preceding embodiments, and will not be repeated in the following.

Figure 5:
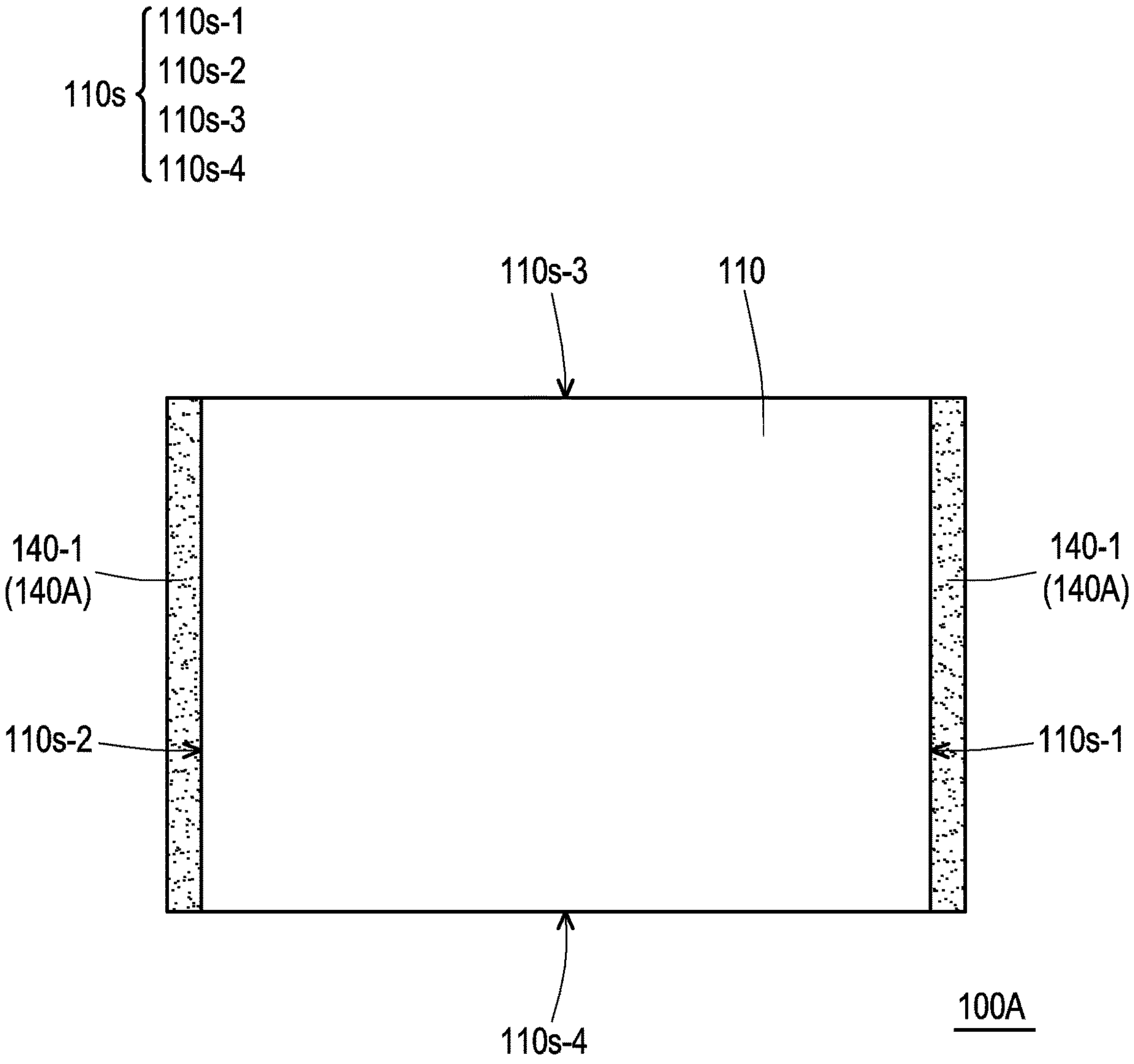
FIG. 5 is a schematic top view of the driving backplane 110 and a fixing glue 140A of a display panel 100A according to another embodiment of the disclosure.

FIG. 5 is a schematic top view of the driving backplane 110 and a fixing glue 140A of a display panel 100A according to another embodiment of the disclosure. The display panel 100A in FIG. 5 is similar to the display panel 100, with the difference that the fixing glue 140A of the display panel 100A in FIG. 5 may be disposed on two opposite sub-side walls (e.g., the first sub-side wall 110*s*-1 and the second sub-side wall 110*s*-2) of the driving backplane 110, instead of on all the sub-side walls of the driving backplane 110.

Figure 6:
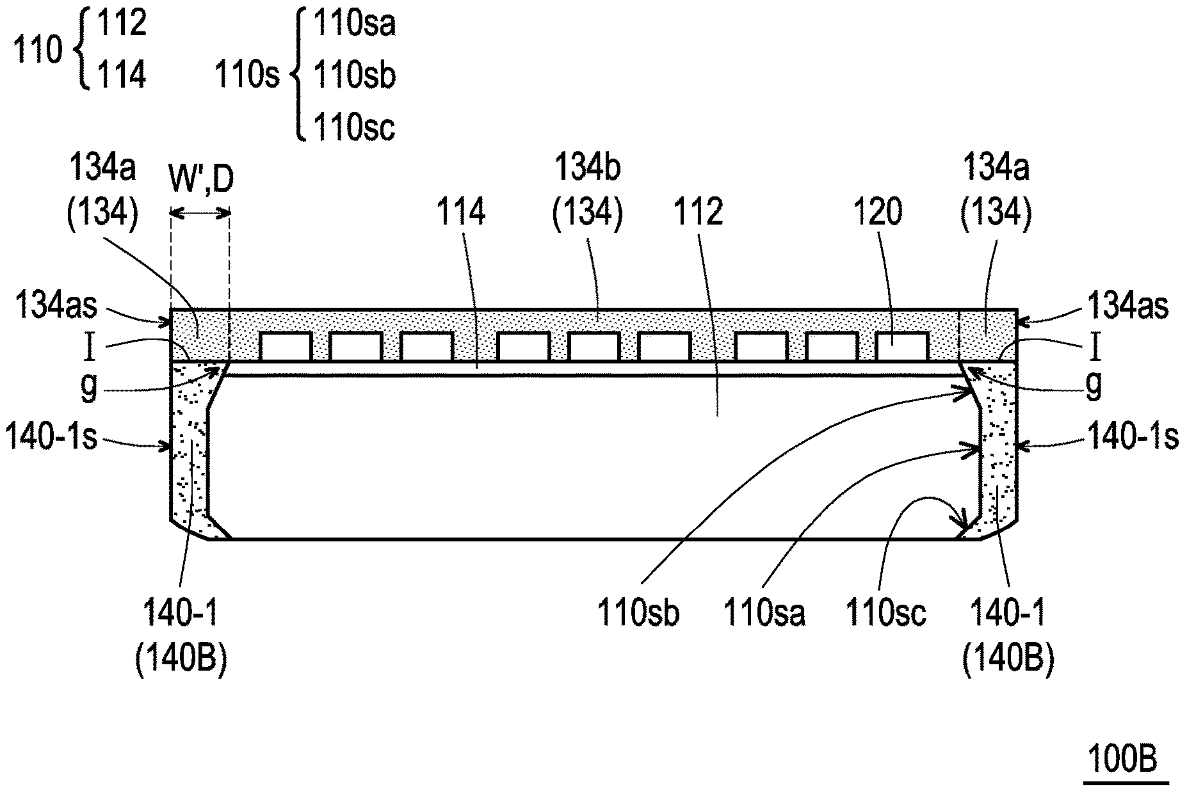
FIG. 6 is a schematic top view of the driving backplane 110 and a fixing glue 140B of a display panel 100B according to yet another embodiment of the disclosure.

FIG. 6 is a schematic top view of the driving backplane 110 and a fixing glue 140B of a display panel 100B according to yet another embodiment of the disclosure. The display panel 100B of FIG. 6 is similar to the display panel 100, with the difference that in the embodiment of FIG. 6, the fixing glue 140B may selectively cover the entire side wall 110*s* of the driving backplane 110 (e.g., the entire first portion 110*sa* and the entire second portion 110*sb* of the side wall 110*s*).

Figure 7:
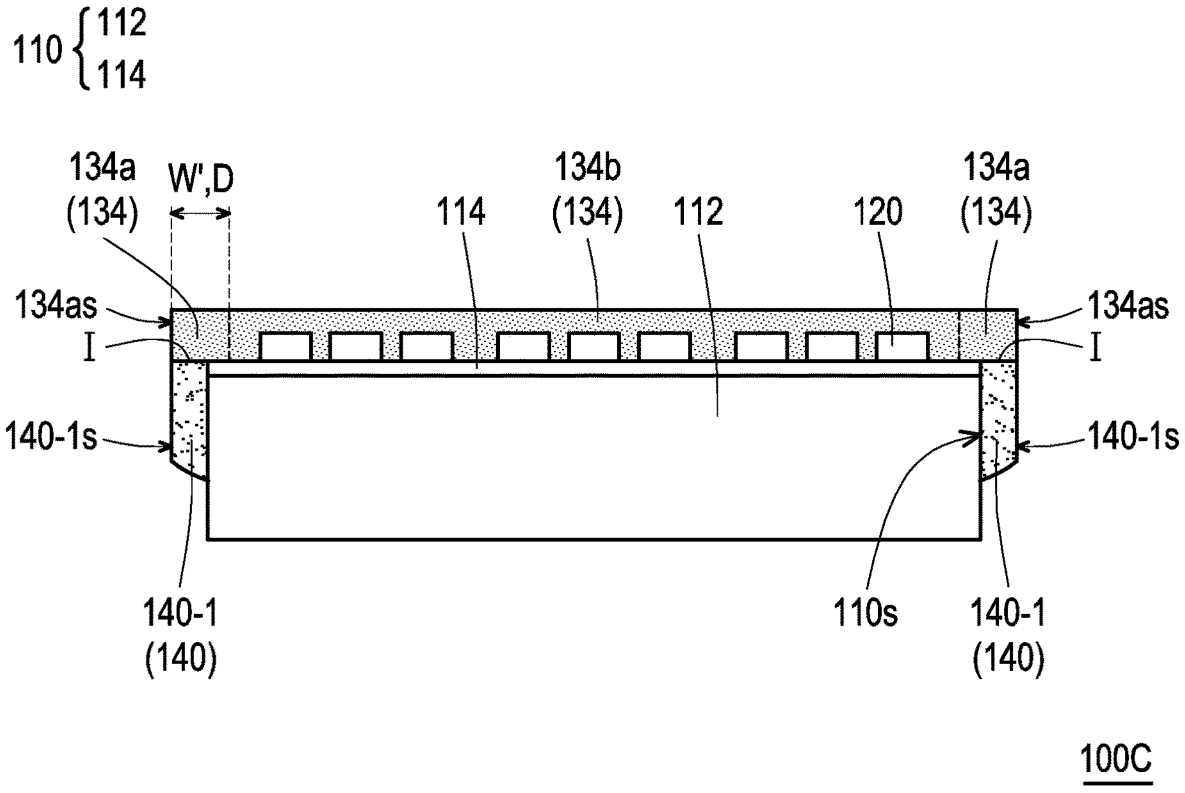
FIG. 7 is a schematic cross-sectional view of a display panel 100C according to a further embodiment of the disclosure.

FIG. 7 is a schematic cross-sectional view of a display panel 100C according to a further embodiment of the disclosure. The display panel 100C in FIG. 7 is similar to the display panel 100 in FIG. 1E, with the difference that the side wall 110*s* of the driving backplane 110 in FIG. 7 may not include the second portion 110*sb* and the third portion 110*sc* of the side wall 110*s* in FIG. 1. That is, in this embodiment, the driving backplane 110 may selectively not have an upper chamfer and a lower chamfer.

It will be apparent to those skilled in the art that various modifications and variations can be made to the disclosed embodiments without departing from the scope or spirit of the disclosure. In view of the forthcoming, it is intended that the disclosure covers modifications and variations provided that they fall within the scope of the following claims and their equivalents.

What is claimed is:

1. A display apparatus comprising:
- a display panel, wherein the display panel comprises:
  - a driving backplane;
  - a plurality of light-emitting elements disposed on the driving backplane and are electrically connected to the driving backplane;
  - an encapsulation layer disposed on the driving backplane and covering the light-emitting elements, wherein the encapsulation layer comprises a protruding portion extending beyond the driving backplane; and
  - a fixing glue disposed between the protruding portion of the encapsulation layer and a side wall of the driving backplane, wherein light transmittance of the fixing glue is higher than light transmittance of the encapsulation layer, and material of the fixing glue is different from material of the encapsulation layer.

2. The display apparatus according to claim 1, wherein adjacent two sides of the fixing glue directly connect the protruding portion of the encapsulation layer and the side wall of the driving backplane respectively.

3. The display apparatus according to claim 1, wherein the side wall of the driving backplane comprises a first portion and a second portion, the second portion of the side wall is connected between the protruding portion of the encapsulation layer and the first portion of the side wall, the second portion of the side wall is inclined with respect to the first portion of the side wall, and the fixing glue is filled into a gap between the second portion of the side wall and the protruding portion of the encapsulation layer.

4. The display apparatus according to claim 1, wherein the encapsulation layer has a boundary with the fixing glue.

5. The display apparatus according to claim 1, wherein the at least one display panel is a plurality of display panels, and the display apparatus further comprises:
- a sealant, wherein the display panels are arranged side by side, there is a gap between the display panels, and the sealant is filled at least in the gap.

6. The display apparatus according to claim 5, wherein Young's modulus of the fixing glue is greater than Young's modulus of the sealant.

* * * * *